United States Patent
Nakamura et al.

(10) Patent No.: US 9,970,989 B2
(45) Date of Patent: *May 15, 2018

(54) SECONDARY BATTERY CELL, BATTERY PACK, AND ELECTRICITY CONSUMPTION DEVICE

(71) Applicant: Murata Manufacturing Co., Ltd., Kyoto (JP)

(72) Inventors: Kazuo Nakamura, Kanagawa (JP); Shinichi Uesaka, Kanagawa (JP); Atsushi Ozawa, Kanagawa (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days. days.

This patent is subject to a terminal disclaimer.

(21) Appl. No.: 15/680,260

(22) Filed: Aug. 18, 2017

(65) Prior Publication Data

US 2017/0343611 A1 Nov. 30, 2017

Related U.S. Application Data

(63) Continuation of application No. 13/884,663, filed as application No. PCT/JP2011/077110 on Nov. 17, 2011, now Pat. No. 9,766,294.

(30) Foreign Application Priority Data

Nov. 19, 2010 (JP) ................................. 2010-258685
Mar. 11, 2011 (JP) ................................. 2011-054407

(51) Int. Cl.
G01R 31/36 (2006.01)
H01M 2/10 (2006.01)
(Continued)

(52) U.S. Cl.
CPC ..... *G01R 31/3606* (2013.01); *G01R 31/3655* (2013.01); *G01R 31/3689* (2013.01);
(Continued)

(58) Field of Classification Search
None
See application file for complete search history.

(56) References Cited

U.S. PATENT DOCUMENTS 2,516,211 A 7/1950 Hochgraf
8,995,699 B2 3/2015 Christensen et al.
(Continued)

FOREIGN PATENT DOCUMENTS

CN 101194219 A 6/2008
EP 1189325 A2 3/2002
(Continued)

OTHER PUBLICATIONS

JPS-31460, Machine Translation, p. 1-7.
(Continued)

*Primary Examiner* — Jermele M Hollington
*Assistant Examiner* — Suresh K Rajaputra
(74) *Attorney, Agent, or Firm* — Chip Law Group

(57) ABSTRACT

There are provided a secondary battery cell, a battery pack, and an electric power consumption device having a configuration and structure capable of accurately and easily detecting the state of the secondary battery cell in the battery pack. A secondary battery cell 20 of the present invention includes an integrated circuit (an IC chip) 60 having a measuring function to measure a battery status, the battery pack has a plurality of secondary battery cells of the present invention, and the electric power consumption device includes the battery pack of the present invention having the plurality of secondary battery cells of the present invention.

8 Claims, 13 Drawing Sheets

(51) Int. Cl.
*H01M 10/42* (2006.01)
*H01M 10/04* (2006.01)
*H01M 2/02* (2006.01)

(52) U.S. Cl.
CPC ......... *H01M 2/105* (2013.01); *H01M 2/1061* (2013.01); *H01M 10/425* (2013.01); *H01M 2/022* (2013.01); *H01M 2/0217* (2013.01); *H01M 2/1016* (2013.01); *H01M 10/0422* (2013.01); *H01M 2010/4271* (2013.01); *H01M 2010/4278* (2013.01)

(56) References Cited

U.S. PATENT DOCUMENTS

| | | | |
|---|---|---|---|
| 9,350,051 B2* | 5/2016 | Teramoto | H01M 10/4257 |
| 9,614,257 B2* | 4/2017 | Teramoto | H01M 10/48 |
| 2002/0039270 A1 | 4/2002 | Sato | |
| 2005/0189425 A1 | 9/2005 | Itou | |
| 2006/0281435 A1 | 12/2006 | Shearer et al. | |
| 2008/0055046 A1 | 3/2008 | Shimizu | |
| 2009/0096413 A1 | 4/2009 | Partovi et al. | |
| 2012/0015221 A1 | 1/2012 | Murase et al. | |
| 2013/0234721 A1* | 9/2013 | Nakamura | H01M 2/105 324/434 |

FOREIGN PATENT DOCUMENTS

| | | |
|---|---|---|
| JP | 8-31460 A | 2/1996 |
| JP | 2002-118957 A | 4/2002 |
| JP | 2003-77525 A | 3/2003 |
| JP | 2008-544730 A | 12/2008 |
| JP | 2010-230355 A | 10/2010 |
| JP | 2010-232103 A | 10/2010 |
| KR | 10-2008-0017460 A | 2/2008 |
| WO | 2006/133204 A2 | 12/2006 |
| WO | 2010/109868 A1 | 9/2010 |

OTHER PUBLICATIONS

JP 2003-77525 Machine Translation, p. 1-17.
International Search Report and Written Opinion of PCT Application No. PCT/JP2011/077110, dated Mar. 6, 2012, 12 pages of English Translation and 11 pages of ISRWO.
International Preliminary Report on Patentability of PCT Application No. PCT/JP2011/077110, dated May 30, 2013, 11 pages of English Translation and 06 pages of IPRP.
Notice of Allowance and Fees Due (PTOL-85) for U.S. Appl. No. 13/884,663, dated May 19, 2017, 10 pages.
Final Rejection for U.S. Appl. No. 13/884,663, dated Mar. 31, 2017, 08 pages.
Non-Final Rejection for U.S. Appl. No. 13/884,663, dated Sep. 16, 2016, 07 pages.
Advisory Action (PTOL-303) for U.S. Appl. No. 13/884,663, dated Aug. 2, 2016, 03 pages.
Final Rejection for U.S. Appl. No. 13/884,663, dated May 17, 2016, 07 pages.
Non-Final Rejection for U.S. Appl. No. 13/884,663, dated Nov. 12, 2015, 09 pages.
Final Rejection for U.S. Appl. No. 13/884,663, dated Jun. 22, 2015, 09 pages.
Non-Final Rejection for U.S. Appl. No. 13/884,663, dated Dec. 2, 2014, 08 pages.

* cited by examiner

20 SECONDARY BATTERY CELL

50A ASSEMBLY OF INTEGRATED CIRCUIT AND ANTENNA

58

58

50A

50 INTEGRATED CIRCUIT

56 ANTENNA

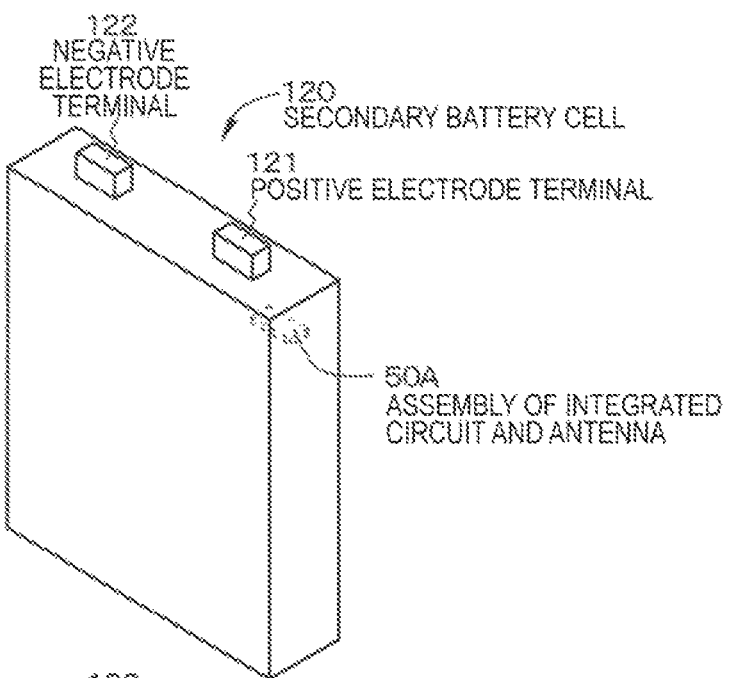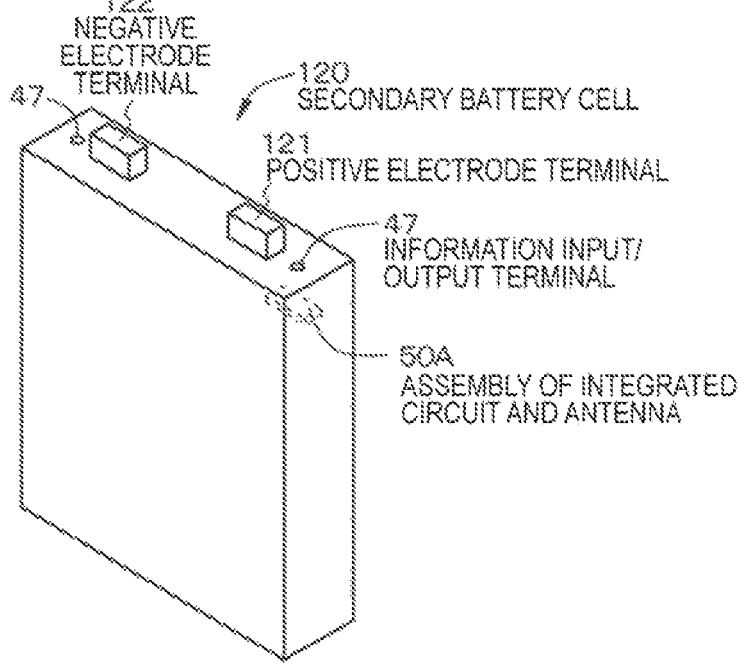

SECONDARY BATTERY CELL, BATTERY PACK, AND ELECTRICITY CONSUMPTION DEVICE

CROSS-REFERENCE TO RELATED APPLICATIONS

The present application is a continuation application of U.S. patent application Ser. No. 13/884,663 filed May 10, 2013, which is a national stage entry of PCT application PCT/JP2011/077110 filed Nov. 17, 2011, which claims the benefit of Japanese Priority Patent Application JP 2011-054407 filed on Mar. 11, 2011, which claims the benefit of Japanese Priority Patent Application JP 2010-258685 filed on Nov. 19, 2010, the entire contents of which are incorporated herein by reference.

TECHNICAL FIELD

The present invention relates to a secondary battery cell, a battery pack, and an electric power consumption device.

BACKGROUND ART

A battery pack has been already used in various portable apparatuses such as a mobile phone, a digital still camera, a portable game machine, a notebook personal computer, and an electric tool. Currently, the battery pack is used not only in these apparatuses, but in a field, in which a higher output and higher capacity are required, such as an electric power-assisted bicycle, an electric vehicle, and further a home-use power storage device.

As a secondary battery cell built in the battery pack, one of the secondary battery cells mainly used currently is a lithium-ion secondary battery cell. The lithium-ion secondary battery cell is used in a very wide range because of its considerable characteristics, i.e., it can be repeatedly used by being charged; it outputs with a high voltage; it has a high energy density; the self-discharge is small; and it has a long life. To respond to the request for the apparatus to have a higher output and a higher capacity, there are increasing cases where the secondary battery cells (single cells) are connected in multi-series or in multi-parallel and used in a form of an assembled battery. There are many advantages in using the secondary battery cell in this way. However, the secondary battery cell has to be more carefully used than ever before, since the used energy amount becomes very large by using it in this way.

Generally, the battery pack is monitored regarding its state, such as an overcharge, an over discharge, an overcurrent, and a temperature. The battery pack includes a control circuit having a battery protection circuit so as not to be used in a dangerous state or a state where the characteristic degradation is caused. Traditionally, when the battery protection circuit operates, the charge/discharge operation of the battery pack as a whole is appropriately stopped so as to guarantee the safety of the battery pack or the electric power consumption device, in which the battery pack is built. Generally, the temperature state of the entire battery pack is monitored. Monitoring the overcharge, the over discharge, and the overcurrent is performed in regard to each secondary battery cell. However, it is actually performed based on the complicated process, in which a measuring unit for measuring a current flowing in each secondary battery cell and a terminal voltage of the secondary battery cell is provided in each secondary battery cell, and the control circuit provided in the battery pack receives the value obtained by the measuring unit through wire transmission, and the control circuit obtains a current value and a terminal voltage value.

A battery authentication system authenticates the secondary battery cell provided in the battery pack to determine whether the battery pack mounted in the electric power consumption device can be safely used for the electric power consumption device. The battery authentication system is widely used, and a technique for reading individual identification information, such as an ID number, from the secondary battery cell including a wireless IC tag is well known from, for example, Japanese Patent Application Laid-Open No. 2006-236806.

CITATION LIST

Patent Document

Patent Document 1: Japanese Patent Application Laid-Open No. 2006-236806

SUMMARY OF THE INVENTION

Problems to be Solved by the Invention

However, the temperature state of the entire battery pack is traditionally monitored, and the temperature of each secondary battery cell is not monitored. Therefore, it is hard to say that the traditional temperature state monitoring of the battery pack is enough. The traditional monitoring of the overcharge, the over discharge, and the overcurrent in the battery pack requires the complicated process as described above. Furthermore, by using the technique disclosed in Japanese Patent Application Laid-Open No. 2006-236806, it can be determined whether the battery pack is an authenticated and authorized battery pack or not. However, the state of the secondary battery cell in the battery pack is still unknown, and it is difficult to optimally control the battery pack including many secondary battery cells.

Therefore, a purpose of the present invention is to provide a secondary battery cell having a configuration and structure capable of accurately and easily detecting the state of the secondary battery cell in a battery pack, a battery pack having the secondary battery cell, and further an electric power consumption device including the battery pack.

The secondary battery cell of the present invention to achieve the purpose above includes an integrated circuit (an IC chip) having a measuring function to measure a battery status.

The battery pack of the present invention to achieve the purpose above has a plurality of secondary battery cells of the present invention.

The electric power consumption device of the present invention to achieve the purpose above includes the battery pack of the present invention having the plurality of secondary battery cells of the present invention.

EFFECTS OF THE INVENTION

Regarding the secondary battery cell, the battery pack, or the electric power consumption device of the present invention, the secondary battery cell includes the integrated circuit, and the integrated circuit has the measuring function to measure the battery status. Therefore, the secondary battery cell itself can collect the battery status information, and the configuration of the entire battery pack can be simplified.

BRIEF DESCRIPTION OF DRAWINGS

FIGS. 11(A) and 11(B) are respectively a schematic perspective view of a secondary battery cell of Example 6 and a schematic perspective view of its modification.

MODE FOR CARRYING OUT THE INVENTION

Figure 1:
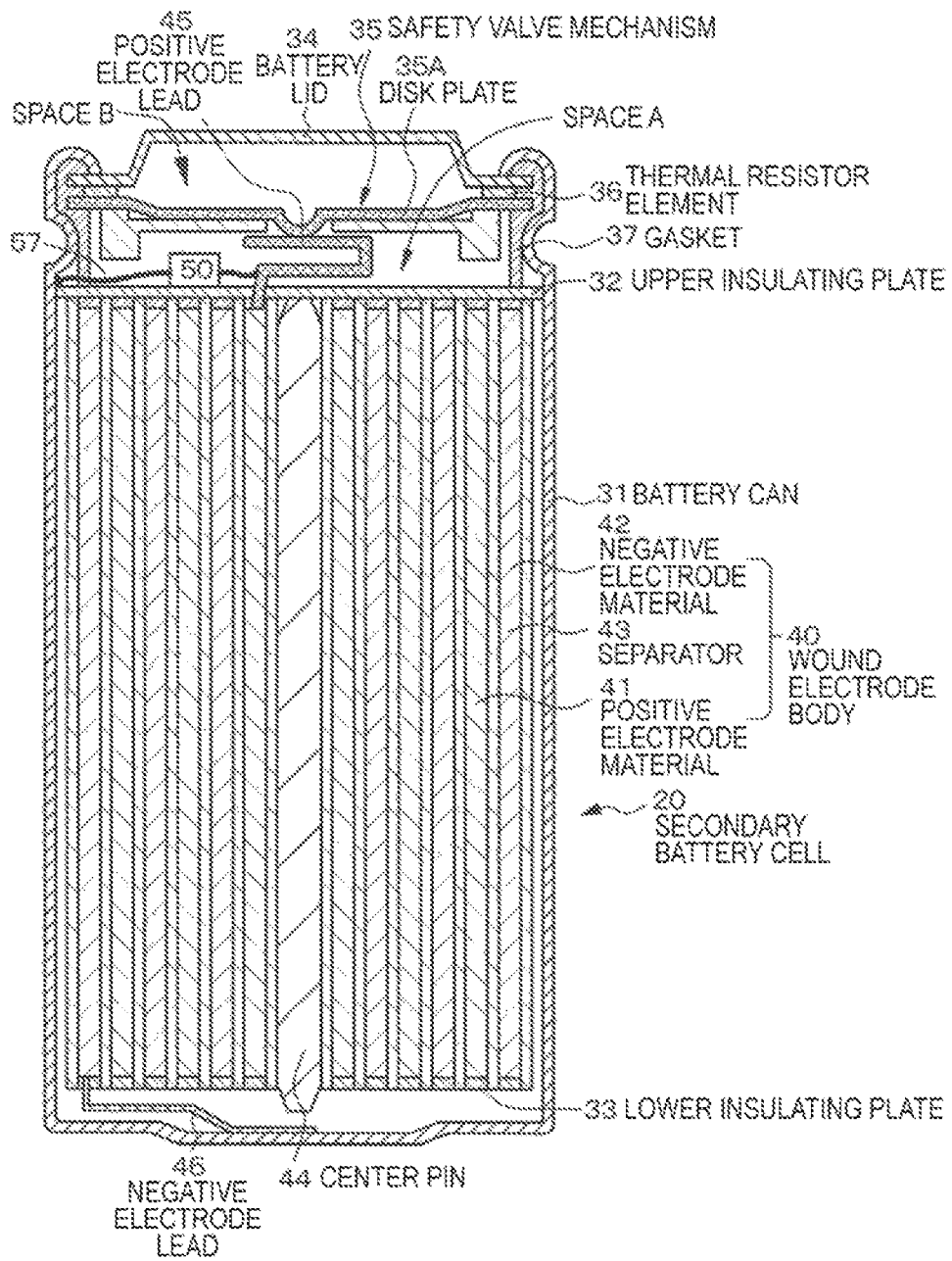
FIG. 1 is a schematic end view of a secondary battery cell of Example 1.

Herein below, the present invention is explained based on the examples referring to the drawings, but the present invention is not limited to these examples, and a variety of values and materials in the examples are presented as examples. Explanation is given in the following order.
1. The general explanation of a secondary battery cell, a battery pack, and an electric power consumption device of the present invention
2. Example 1 (the secondary battery cell, the battery pack, and the electric power consumption device of the present invention)
3. Example 2 (a modification of Example 1)
4. Example 3 (another modification of Example 1)
5. Example 4 (still another modification of Example 1)
6. Example 5 (yet another modification of Example 1)
7. Example 6 (still yet another modification of Example 1), and others

[The General Explanation of a Secondary Battery Cell, a Battery Pack, and an Electric Power Consumption Device of the Present Invention]

In the secondary battery cell of the present invention, the secondary battery cell in the battery pack of the present invention, and the secondary battery cell in the electric power consumption device of the present invention (hereinafter collectively referred to as "a secondary battery cell or the like of the present invention"), the integrated circuit can have stored individual information. Here, as the individual information, at least one kind of information, which is selected from the group consisting of an identification number (an ID number) given to the secondary battery cell, an authentication number given to the secondary battery cell, the name of a manufacturer of the secondary battery cell, the name of a seller of the secondary battery cell, a model number of the secondary battery cell, a rating of the secondary battery cell, a specification of the secondary battery cell, an identification number (an ID number) given to the integrated circuit itself, and key information to authenticate the secondary battery cell, can be exemplified. In addition, when the individual information is the identification number or the authentication number given to the secondary battery cell, it can be easily and surely determined whether the secondary battery cell is the authenticated and authorized secondary battery cell or not.

In the secondary battery cell or the like of the present invention including the preferred embodiment described above, the battery status (battery information) measured by the integrated circuit can be a form of at least one of the physical quantities selected from the group consisting of a battery temperature, a battery current, and a battery terminal voltage. Here, the battery temperature means a temperature inside the secondary battery cell or a temperature of the external surface of the secondary battery cell, although it changes depending on where in the secondary battery cell the integrated circuit is arranged. The battery current means the value of a current flowing between a positive electrode and a negative electrode of the secondary battery cell. Furthermore, the battery terminal voltage means the value of a voltage between the positive electrode and the negative electrode of the secondary battery cell.

In the secondary battery cell or the like of the present invention including the preferred embodiment described above, it is preferred that the integrated circuit have a configuration to operate by an electric power based on the electrical signal from the outside of the secondary battery cell (i. e., operates by an external power source) and to transmit the individual information and/or the measured battery status to the outside. With this configuration, the integrated circuit itself can be downsized, and the manufacturing cost can also be reduced. In this case, it is more preferred that the integrated circuit be configured to receive the electrical signal from outside of the secondary battery cell and to obtain the electric power by rectifying the electrical signal. Furthermore, in these configurations,

[A] If the integrated circuit is configured to wirelessly transmit the individual information and/or the measured battery status to the outside of the secondary battery cell, thereby the configuration of the battery pack can be very simplified, or

[B] The integrated circuit can be configured to transmit the individual information and/or the measured battery status to the outside of the secondary battery cell through wire transmission. In the case of [B] and in the case where the integrated circuit is arranged in the secondary battery cell, it is preferred that the integrated circuit be configured to connect to an information input terminal and an information output terminal provided in the secondary battery cell or to connect to an information input/output terminal. Therefore, a wiring for sensing of the entire battery pack can be simplified, and the number of connection points with the control circuit can be reduced, and the reliability of the battery pack can be improved. Alternatively, in the case of [B], the integrated circuit can be configured to connect to an electric power line, which is provided in the secondary battery cell, to supply the electric power to the outside so that the individual information and/or the measured battery status can be transmitted to the control circuit with it being superimposed on an electric power line path, and the configuration can be simplified. Furthermore, in this case, it is preferred to be configured such that a bandpass filter be provided between the integrated circuit and the electric power line. It is only necessary for the bandpass filter to pass a frequency suitable for the communication frequency to transmit the individual information and/or the measured battery. The bandpass filter may be integrated in the integrated circuit or may be provided separately from the integrated circuit.

In the battery pack of the present invention including the preferred embodiment described above or in the battery pack in the electric power consumption device of the present invention, a connection configuration of the plurality of secondary battery cells can be exemplified: a form in which the plurality of secondary battery cells is connected in parallel and the plurality of parallel-connected units is connected in series; and a form in which the plurality of secondary battery cells is connected in series and the plurality of series-connected units is connected in parallel, but the connection configuration is not limited to these.

The integrated circuit can be configured such that the integrated circuit is connected wirelessly or through wire transmission to the control circuit included in the battery pack or provided outside the battery pack, and the battery status and the individual information from the integrated circuit are transmitted wirelessly or through wire transmission to the control circuit. The form, in which the integrated circuit is connected to the control circuit provided in the battery pack via a wire, includes a form in which the integrated circuit is connected to the electric power line described above. The control circuit can be configured of a circuit having an MPU and storage means (for example, including an EEPROM). The control circuit has a communication circuit to receive the battery status and the individual information from the integrated circuit and to exchange information with the integrated circuit, as necessary. It is preferred that the individual information be stored in the control circuit. Depending on the circumstances, a sequencer can be used as an alternative to the MPU. The integrated circuit can be controlled by transmitting the electrical signal from the control circuit to the secondary battery cell. The control circuit corresponds to "outside". In the case of wireless communication, examples of the method therefor can include an infrared ray including ZigBee and IrDA, wireless LAN protocols such as Bluetooth and HomeRF, Wi-Fi, NFC, ISO/IEC 18092, and ISO/IEC 14443.

The integrated circuit may be arranged in the secondary battery cell or may be arranged on the outer surface of the secondary battery cell. Thus, in various preferred embodiments and configurations of the secondary battery cell or the like of the present invention, there are eight forms in total:

[1] a form in which the integrated circuit is arranged in the secondary battery cell, the power source is the external power source, and information is transferred by a wireless method;

[2] a form in which the integrated circuit is arranged in the secondary battery cell, the power source is the external power source, and information is transferred by a wired method;

[3] a form in which the integrated circuit is arranged in the secondary battery cell, the power source is the secondary battery cell, and information is transferred by a wireless method;

[4] a form in which the integrated circuit is arranged in the secondary battery cell, the power source is the secondary battery cell, and information is transferred by a wired method;

[5] a form in which the integrated circuit is arranged outside the secondary battery cell, the power source is the external power source, and information is transferred by a wireless method;

[6] a form in which the integrated circuit is arranged outside the secondary battery cell, the power source is the external power source, and information is transferred by a wired method;

[7] a form in which the integrated circuit is arranged outside the secondary battery cell, the power source is the secondary battery cell, and information is transferred by a wireless method;

[8] a form in which the integrated circuit is arranged outside the secondary battery cell, the power source is the secondary battery cell, and information is transferred by a wired method. It is preferred that the forms [1], [3], [4], [5], [7], and [8] be adopted. The wired method includes the form described above in which the integrated circuit is connected to the electric power line.

In the case where the integrated circuit is arranged in a cylindrical secondary battery cell, the integrated circuit can be arranged in an appropriate space, such as a gap existing between an upper insulating plate and a safety valve mechanism provided in the secondary battery cell and a gap existing just below a battery lid or a cap. When the integrated circuit is arranged in a prismatic secondary battery cell including a laminated type, the integrated circuit may be arranged in an appropriate space such as a gap surrounded by an insulating spacer arranged just below a sealing plate (a cap plate) or in a laminated part. When the battery current and/or the battery terminal voltage is measured by the integrated circuit or when the power source is the secondary battery cell, the integrated circuit may be connected to the positive electrode or a positive electrode extension part (for example, a positive electrode lead, a positive electrode pin, or the battery lid) and the negative electrode or a negative electrode extension part (for example, a negative electrode lead or a battery can), or may be connected to a thermal resistor element (Positive Temperature Coefficient, PCT element) and the negative electrode or the negative electrode extension part.

On the other hand, when the integrated circuit is arranged outside the secondary battery cell, the integrated circuit may be stuck on the outside of the secondary battery cell, or the integrated circuit may be laminated on the outside of the secondary battery cell by appropriate means. The integrated circuit can be connected by using a part of an exterior film as an antenna, the wiring or the like. When the battery current and/or the battery terminal voltage is measured by the integrated circuit or when the power source is the secondary battery cell, the integrated circuit may be connected to the positive electrode or the positive electrode extension part and the negative electrode or the negative electrode extension part by using appropriate means. When the information is transferred by the wireless method, the integrated circuit can be configured to have the antenna. Depending on the circumstances, an electrode and the battery lid of the secondary battery cell can be used as the antenna. The antenna may also be formed by patterning an exterior material of the secondary battery. The antenna may be a coiled antenna or may be a dipole antenna, for example. When the information is transferred by the wired method, the control circuit may be connected to the secondary battery cell by the wiring for sensing or may be connected by the electric power line.

To measure the battery temperature, it is necessary for the integrated circuit to have a pn junction part, for example. As a built-in potential (a built-in voltage) of the pn junction part has a temperature dependence, the temperature of the secondary battery cell can be obtained by measuring a voltage value by applying a forward current to the pn junction part or by measuring a current value by applying a forward constant voltage to the pn junction part. To measure the battery current, a well-known current measuring circuit may be provided in the integrated circuit. To measure the battery terminal voltage, a known voltage measuring circuit may be provided in the integrated circuit.

A lithium-ion secondary battery can be exemplified as the secondary battery cell, but the secondary battery cell is not limited to this. Depending on the required characteristics, a kind of the secondary battery to be used may be arbitrarily selected. The configuration and the structure of the secondary battery cell itself may be a known configuration and structure, and the shape of the secondary battery cell may be a known cylinder and prism. A charge/discharge control circuit to control the charge and the discharge of the secondary battery cell can be configured of a well-known circuit having the MPU and the storage means (for example, including an EEPROM). The charge/discharge control circuit may have a known battery protection circuit. As necessary, the battery protection circuit may be operated to stop the function of the battery pack. Also, the charge/discharge control circuit may be integrated in the control circuit described above.

The battery pack of the present invention can be applied to various electric power consumption devices, such as an electric vehicle (including a hybrid vehicle), a golf cart, an electric cart, an electric motorcycle, an electric power-assisted bicycle, a railroad vehicle, an electric tool such as an electric drill, an electric power supply unit or a home energy server (a power storage device for home use), a personal computer, a mobile phone, a PDA (personal digital assistant), a digital still camera or a video camera, a camcorder, an e-book, an electronic dictionary, a music player, a radio, headphones, a cordless phone handset, an electric shaver, a refrigerator, an air conditioner, a television receiver or an image display device, a monitor, stereo equipment, a water heater, a microwave, a dishwashing machine, a washing machine, a drier, lighting equipment such as an interior light, a game machine, a navigation system, a memory card, a pacemaker, a hearing aid, medical equipment, a toy, a robot, a road conditioner, and a signal. The battery pack can be a driving power source or an auxiliary power source of these electric power consumption devices. The battery pack of the present invention can also be applied to equipment such as a power source to store the electric power for an architectural structure including a house or for an electric power facility, and can be used to supply the electric power to such equipment, and can be used as a power storage device in a so-called smart grid. These power storage devices can not only supply the electric power but also store the electric power by being supplied with the electric power from other electric power source. Furthermore, the battery pack of the present invention can be incorporated in a Home Energy Management System (HEMS) or Building Energy Management Systems (BEMS). As the power source to charge the secondary battery cell constituting the battery pack, not only a commercial power source but also various kinds of solar batteries, fuel cells, thermal power plants, nuclear power plants, hydraulic power plants, wind power stations, micro hydro power plants, and geothermal power stations can be exemplified, and regenerative energy generated by the electric power consumption device can also be exemplified, but the power source is not limited to these.

EXAMPLE 1

Figure 2A:
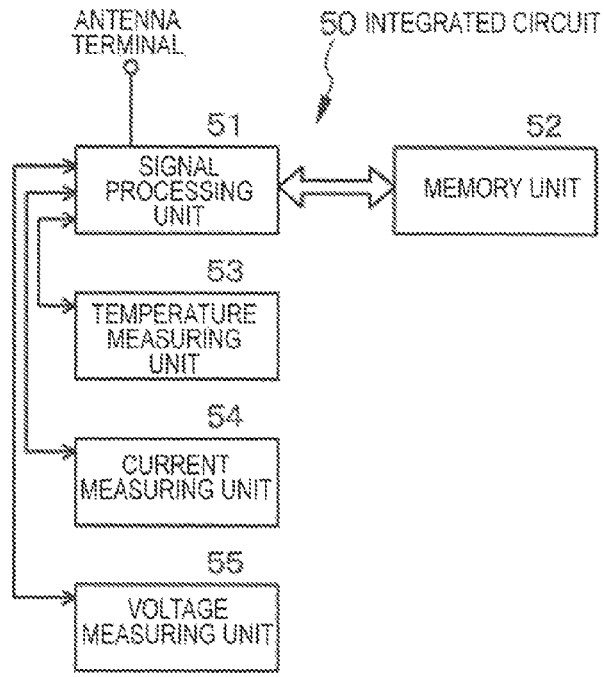
FIG. 2(A) is a block diagram of an integrated circuit in Example 1.
Figure 2B:
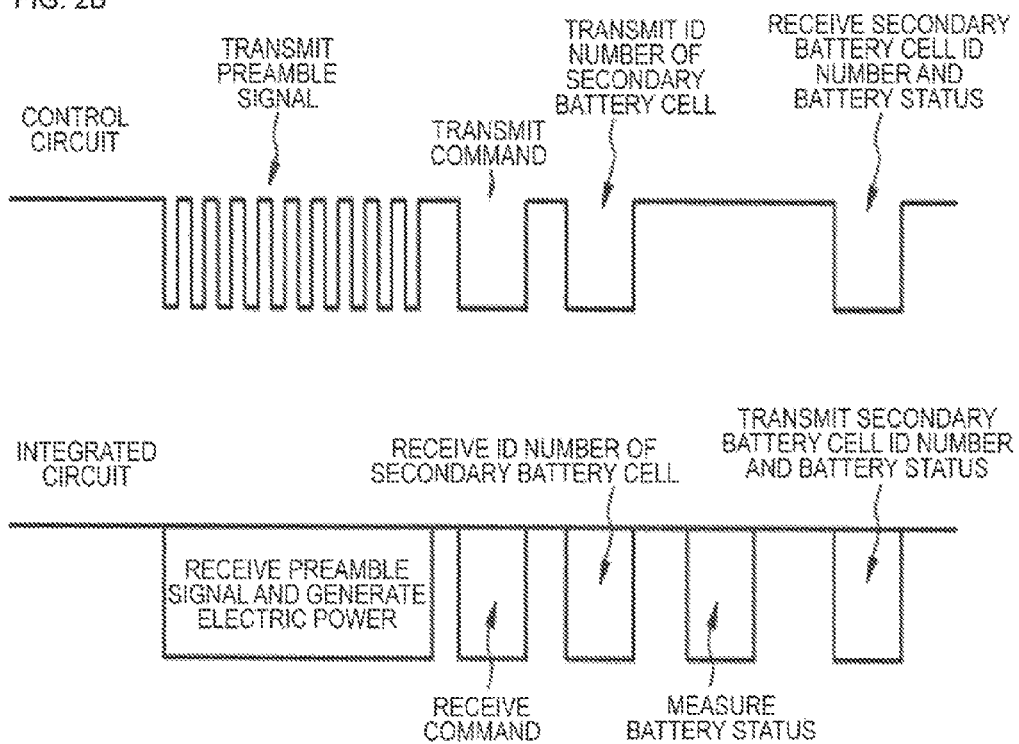
FIG. 2(B) is a view schematically showing transmission/reception of an electrical signal in Example 1.
Figure 3:
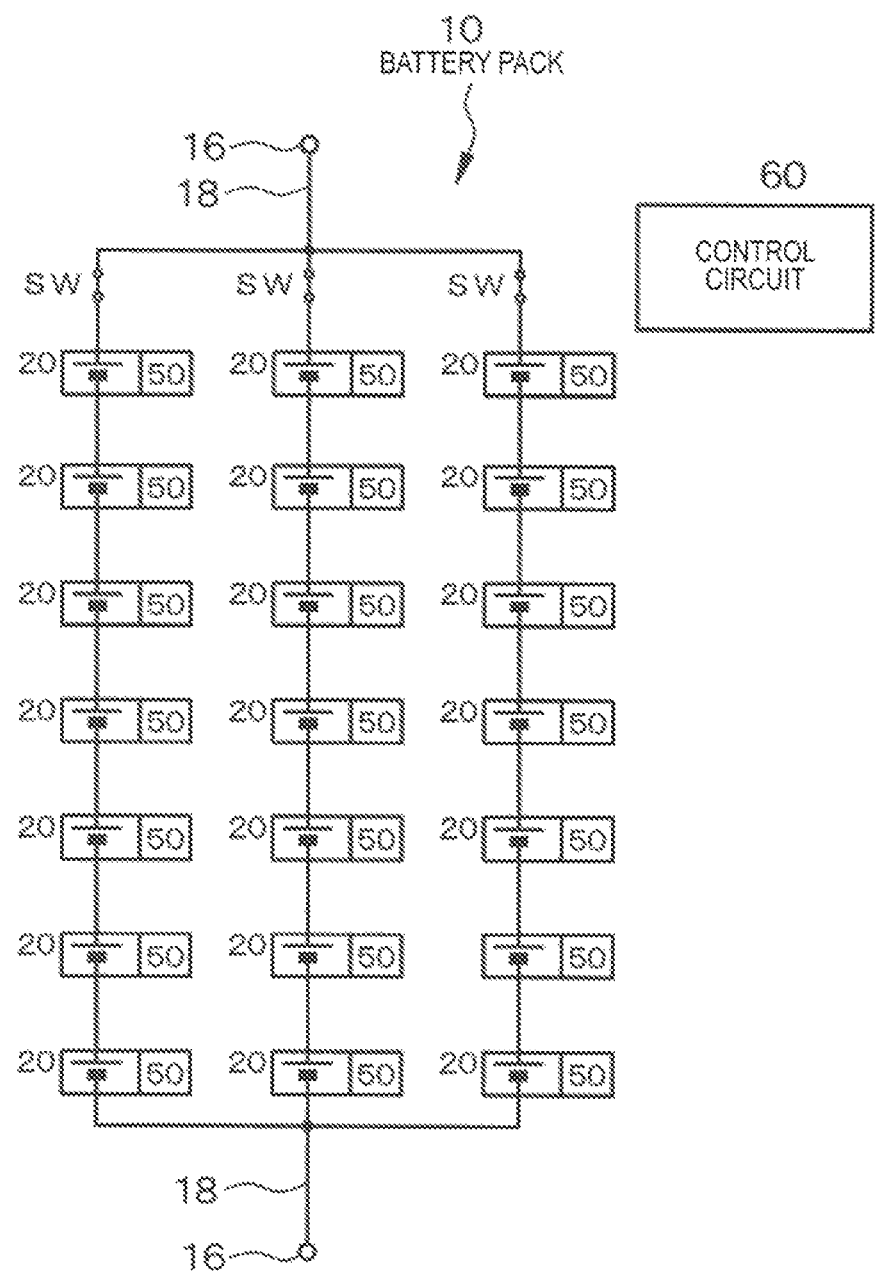
FIG. 3 is a view showing a connection status of the secondary battery cells in a battery pack of Example 1.
Figure 4A:
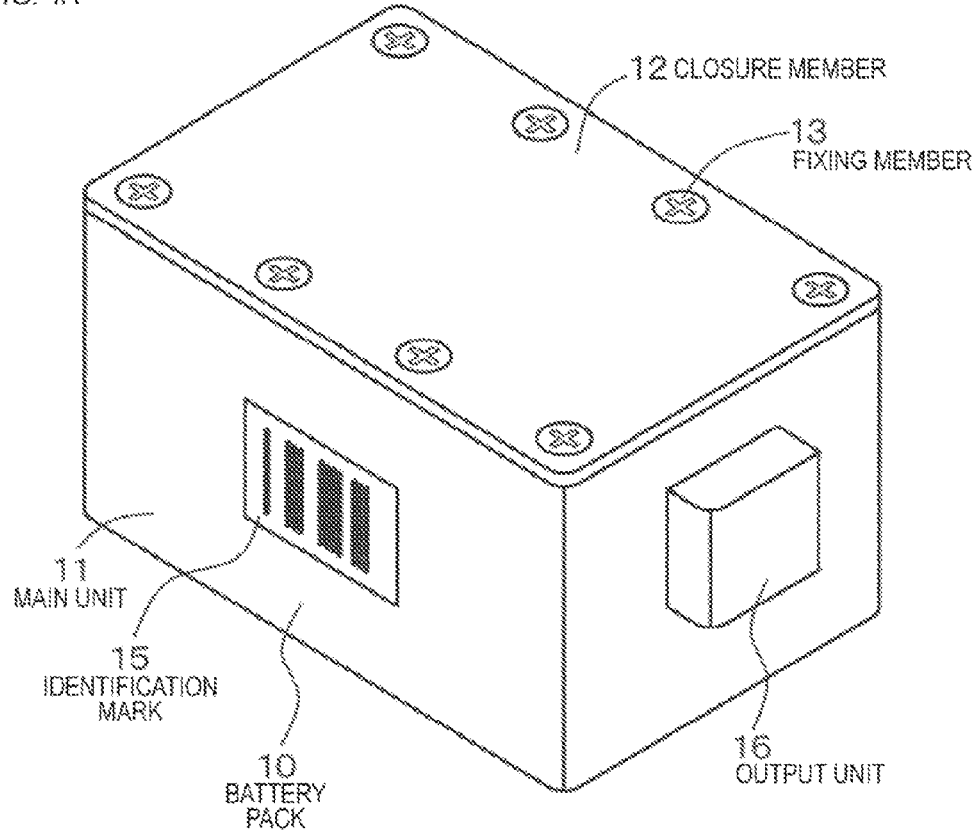
FIG. 4(A) is a schematic perspective view of the battery pack.
Figure 4B:
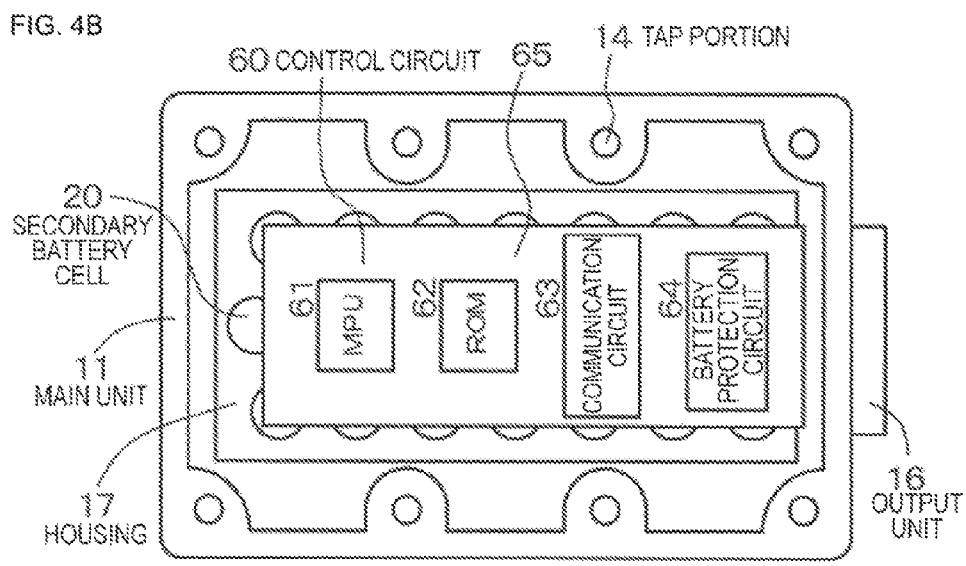
FIG. 4(B) is a schematic view of the battery pack from which a lid has been removed.

Example 1 relates to a secondary battery cell, a battery pack, and an electric power consumption device of the present invention. FIG. 1 is a schematic end view of the secondary battery cell of Example 1. FIG. 2(A) is a block diagram of an integrated circuit in Example 1, and FIG. 2(B) is a view schematically showing transmission/reception of an electrical signal in Example 1. FIG. 3 is a view showing a connection status of the secondary battery cells. FIG. 4(A) is a schematic perspective view of the battery pack, and FIG. 4(B) is a schematic view of the battery pack from which a lid has been removed.

The secondary battery cells of Example 1 or Examples 2 to 6, which will be described below include an integrated circuit (an IC chip) 50 having a measuring function to measure a battery status (battery information). Furthermore, the integrated circuit 50 stores individual information in Example 1 or Examples 2 to 6, which will be described below. Here, the individual information is, for example, an identification number (an ID number) and an authentication number given to each secondary battery cell 20. Also, as the individual information, the name of a manufacturer, the name of a seller, a model number, a rating, and a specification of the secondary battery cell, an identification number (an ID number) given to the integrated circuit itself, and key information to authenticate the secondary battery cell may be further added.

A battery pack 10 of Example 1 has a plurality of secondary battery cells 20 of Example 1. As shown in FIG. 3, as the connection status (a status of an assembled battery) of the secondary battery cells in the battery pack 10 in Example 1 or Examples 2 to 6, which will be described below, the plurality of secondary battery cells 20 is connected in series, and the plurality of series-connected units is connected in parallel, but it is not limited. More specifically, in the battery pack 10, seven secondary battery cells 20 are connected in series, and three series-connected units, which include a group of the secondary batteries connected in series, are connected in parallel. The secondary battery cell 20 is contained in a housing 17 configured of a plastic material, such as ABS resin. The series-connected unit is connected to an electric power line 18 to supply the electric power to the outside, and the electric power line 18 is connected to an output unit 16, which will be described below.

In Example 1, the integrated circuit 50 operates by the electric power based on an electrical signal (an external electrical signal) from outside the secondary battery cell 20. That is, the integrated circuit 50 operates by the external power source. The individual information and the measured battery status are transmitted to the outside. Here, in Example 1, the integrated circuit 50 obtains the electric power by receiving the electrical signal (the external electrical signal) from outside the secondary battery cell 20 at predetermined time intervals and by rectifying the external electrical signal. Furthermore, the integrated circuit 50 wirelessly transmits the individual information and the measured battery status to the outside of the secondary battery cell 20. Here, more specifically, the outside is a control circuit (a control device) 60. That is, the integrated circuit 50 is wirelessly connected to the control circuit 60 provided in the battery pack 10, and the battery status and the individual information from the integrated circuit 50 are wirelessly transmitted to the control circuit 60. The integrated circuit 50 is connected to a battery lid 34 of the secondary battery cell 20 by a wiring (not shown) and uses the battery lid 34 as an antenna. Depending on the case, the integrated circuit 50 may include an independent antenna. The control circuit 60 is configured of an MPU 61 and a circuit having storage means 62 including an EEPROM, for example, includes a communication circuit 63 to receive the battery status and the individual information from the integrated circuit 50 and to exchange information with the integrated circuit 50, and transmits the external electrical signal to the secondary battery cell 20 at the predetermined time intervals. A charge/discharge control circuit to control the charge and discharge of the secondary battery cell 20 is further incorporated into the control circuit 60. The control circuit 60 stores the individual information in the storage means 62 and collates it with the individual information from the integrated circuit 50. A power source of the control circuit 60 is the secondary battery cell 20 constituting the battery pack 10. A well-known battery protection circuit 64 is provided in the control circuit 60, and the battery protection circuit 64 may be operated to stop the function of the battery pack 10 as necessary. More specifically, the battery protection circuit 64 includes a fuse, and the battery protection circuit 64 is operated to stop the function of the battery pack 10. That is, the fuse may be fused under the control of the MPU 61. Functions of an over discharge prevention switch and an overcharge prevention switch provided in the battery protection circuit 64 may also be stopped. However, the battery protection circuit 64 is not limited to these configurations. As mentioned above, the integrated circuit 50 is arranged in the secondary battery cell 20, the power source is the external power source, the information is transferred by the wireless method, i.e., the integrated circuit 50 is in the form of [1] described above, and the battery status can be known without providing a special wiring for sensing.

In Example 1, the secondary battery cell 20 is a cylindrical secondary battery cell and includes a lithium-ion secondary battery. The configuration and the structure of the secondary battery cell 20 itself can be a well-known configuration and structure. The integrated circuit 50 is arranged in a space A existing between an upper insulating plate 32 and a safety valve mechanism 35 arranged in the secondary battery cell 20. The integrated circuit 50 may be arranged in a space B existing just below the battery lid 34.

In Example 1 or Examples 2 to 6, which will be described below, the battery status measured by the integrated circuit 50 is at least one of the physical quantities selected from the group consisting of a battery temperature, a battery current, and a battery terminal voltage, more specifically, that is three physical quantities, i.e., the battery temperature, the battery current, and the battery terminal voltage in Examples. However, not limited in this regard, it can be only the battery temperature, only the battery current, only the battery terminal voltage, the battery temperature and the battery current, the battery temperature and the battery terminal voltage, or the battery current and the battery terminal voltage. To measure the battery temperature, the integrated circuit 50 has a pn junction part. To measure the battery current, a well-known current measuring circuit (in particular, a current measuring circuit configured of, for example, a combination of a shunt resistance, an operational amplifier, and an AD converter, a combination of a current transformer or an element type current sensor or a magnetic resonance current sensor and the operational amplifier, and the AD converter, and a combination of a reference voltage generation circuit, a resistance, and the AD converter) is provided in the integrated circuit 50. To measure the battery terminal voltage, a well-known voltage measuring circuit (in particular, a voltage measuring circuit configured of, for example, a combination of the operational amplifier and the AD converter and a combination of the reference voltage generation circuit, a resistance voltage divider, and the AD converter) is provided in the integrated circuit 50.

In the secondary battery cell 20 including the lithium-ion secondary battery of Example 1, a wound electrode body 40, obtained by winding a positive electrode material 41 and a negative electrode material 42 via a separator 43, and a pair of insulating plates (the upper insulating plate 32 and a lower insulating plate 33) are contained in a battery can 31 substantially shaped in a hollow cylinder. The separator 43 separates the positive electrode material 41 and the negative electrode material 42, and passes the lithium-ion while preventing a short-circuiting by the contact between the positive electrode material 41 and the negative electrode material 42. The battery can 31 is made of a nickel-plated iron, for example. One end thereof is closed, and another end is opened and constitutes an opening end. The pair of insulating plates 32 and 33 is arranged to sandwich the wound electrode body 40 and to be located perpendicularly to a winding peripheral surface.

In the opening end of the battery can 31, the battery lid 34, and the safety valve mechanism 35 and a thermal resistor element (a PTC element) 36 provided inside the battery lid 34 are mounted by being caulked via a gasket 37, and the inside of the battery can 31 is sealed. The battery lid 34 is made of the same material as the battery can 31, for example. The safety valve mechanism 35 is electrically connected to the battery lid 34 via the thermal resistor element 36. The safety valve mechanism 35 is configured such that, a disk plate 35A is turned over in the case where the internal pressure is above a certain value due to the internal short-circuiting or the heating from outside, so that the electrical connection between the battery lid 34 and the wound electrode body 40 is disconnected. The thermal resistor element 36 limits the current and prevents abnormal exotherm due to a large current by the increase of the resistance according to the increase of the temperature. The gasket 37 is made of an insulating material, for example, and asphalt is applied on its surface.

In the center of the wound electrode body 40, for example, a center pin 44 is inserted. In the wound electrode body 40, a positive electrode lead 45 made of aluminum or the like is connected to the positive electrode material 41, and a negative electrode lead 46 made of nickel or the like is connected to the negative electrode material 42. The positive electrode lead 45 is electrically connected to the battery lid 34 by being welded to the safety valve mechanism 35. On the other hand, the negative electrode lead 46 is welded to the battery can 31.

The lithium-ion secondary battery is manufactured as follows, for example.

First, the positive electrode material 41 and the negative electrode material 42 are made by a well-known method. Next, while the positive electrode lead 45 is mounted by being welded to the positive electrode material 41, the negative electrode lead 46 is mounted by being welded to the negative electrode material 42. Subsequently, the wound electrode body 40 is formed by winding the positive electrode material 41 and the negative electrode material 42 via the separator 43 and a front end portion of the positive electrode lead 45 is welded to the safety valve mechanism 35, after a front end portion of the negative electrode lead 46 is welded to the battery can 31, the wound electrode body 40 is contained in the battery can 31 while being sandwiched between the pair of insulating plates 32 and 33. Electrolytic solution is introduced into the battery can 31 and the separator 43 is impregnated with the electrolytic solution. Finally, the integrated circuit 50 is mounted in the battery can 31, and the battery lid 34, the safety valve mechanism 35, and the thermal resistor element 36 are fixed to the opening end of the battery can 31 by being caulked via the gasket 37. In this way, the lithium-ion secondary battery shown in FIG. 1 can be completed.

In the battery pack 10 of Example 1, each of twenty-one secondary battery cells 20 is contained in a container provided in the housing 17. When all the secondary battery cells 20 are contained in the container, the housing 17 is stored in a main unit 11 of the battery pack 10, and a printed-wiring board 65, to which the MPU 61 or the like is mounted, is mounted to the main unit 11 in an appropriate way (refer to FIG. 4(B)) above the housing 17. A closure member (in particular, a lid) 12 is put on the main unit 11, and a fixing member (for example, a screw) 13 is screwed together with a fixing part (for example, a bush, on which a tap portion 14 is provided) provided on the main unit 11. A reference numeral 15 denotes an identification mark (a serial ID, a bar code) attached on a sidewall of the main unit 11, and the output unit 16 is provided on the sidewall of the main unit 11. A shape of the main unit 11 is essentially arbitrary, but it is a rectangular parallelepiped in Example 1. An opening to put in/out the plurality of secondary battery cells 20 to/from the main unit 11 is provided on the top surface of the main unit 11, and the closure member 12 closes the opening. However, the opening may be provided on a side surface of the main unit 11, or may be provided on the bottom surface of the main unit 11.

As a block diagram of the integrated circuit 50 of Example 1 is shown in FIG. 2(A), the integrated circuit 50 includes a signal processing unit 51 for processing an input/output signal, a memory unit 52, which is necessary for the storage of the individual information or various processing, a temperature measuring unit (a temperature measuring circuit) 53 for measuring the battery temperature, a current measuring unit (a current measuring circuit) 54 for measuring the battery current, and a voltage measuring unit (a voltage measuring circuit) 55 for measuring the battery terminal voltage. In addition, there is no need to implement all of the temperature measuring unit 53, the current measuring unit 54, and the voltage measuring unit 55 to the integrated circuit 50. It is only necessary to implement by selecting the function depending on the usage. The current measuring unit 54 and the voltage measuring unit 55 of the integrated circuit 50 are connected to the positive electrode lead 45 and the battery can 31 via a wiring 57 to measure the current and the voltage. In addition, the wiring 57 for connecting the integrated circuit 50 and the battery can 31 holds the sealed state with the gasket 37, although it is not shown.

As described above, the integrated circuit 50 receives the external electrical signal, in particular, an external electrical signal generated in the control circuit 60 and transmitted via the communication circuit 63 at predetermined time intervals. The electric power is obtained by rectifying the external electrical signal. The electrical signal in the communication processing between the integrated circuit 50 shown in FIG. 2(A) and the control circuit 60 is shown in FIG. 2(B). First, the external electrical signal including a preamble signal is transmitted from the control circuit 60 to the integrated circuit 50 via the communication circuit 63. At the side of the integrated circuit 50, the transmitted external electrical signal is received, and the external electrical signal is rectified to secure the necessary electric power for the operation in the integrated circuit 50. After that, a command and the ID number of the secondary battery cell 20 are transmitted from the control circuit 60 to the integrated circuit 50 via the communication circuit 63. At the side of the integrated circuit 50, in accordance with a control signal (in particular, the external electrical signal, such as the command and the ID number), the battery status of the secondary battery cell 20 having the integrated circuit 50 is measured, if the transmitted ID number corresponds to the ID number of the integrated circuit itself. The integrated circuit 50 transmits the measured battery status and the control circuit 60 receives it so that the battery status can be known. These operations and processing are performed to all of the secondary battery cells 20 in sequence. By this method, a power source part is not needed, because the integrated circuit 50 obtains the necessary electric power for the operation based on the external electrical signal from outside (in particular, the control circuit 60). Further, by this method, since the battery status is transmitted from the integrated circuit 50 provided in the secondary battery cell 20 when the ID number transmitted from outside (in particular, the control circuit 60) is compared with and, as a result, corresponds to the ID number of the integrated circuit itself, the respective battery statuses in the battery pack 10 configured of many secondary battery cells 20 can be obtained without getting confused. The control circuit 60 determines whether something is wrong with the secondary battery cell 20 or not based on the received battery status. If there is something wrong with the secondary battery cell 20, i.e., if an abnormal temperature increase of the secondary battery cell 20, an abnormal current flow in the secondary battery cell 20, or an abnormal voltage value change in the secondary battery cell 20 occurs, a switch SW provided in the series-connected unit is turned off and the series-connected unit including the secondary battery cell 20, in which something has gone wrong, may be disconnected from the battery pack 10 under the control of the control circuit 60. Depending on the case, the output from the battery pack 10 may be stopped. The warning or the like indicating that something has gone wrong with the secondary battery cell may be given to a user using the battery pack 10. Also, in the case where the something is wrong with the integrated circuit 50 and the communication is unavailable, the same procedure is preferred to be performed.

In addition, the information in the communication path and the integrated circuit 50 may be encrypted, making it difficult to decrypt even if a third party intercepts the communication. In the case where an authentication operation is provided between the integrated circuit 50 and the control circuit 60, even if the secondary battery cell 20 in the battery pack 10 is replaced with an unauthorized product, the warnings or the like can be given to the user using the battery pack 10 when the authentication is not established.

The battery pack 10 can be applied to the electric power consumption device, for example, an electric vehicle (including a hybrid vehicle), a golf cart, an electric cart, an electric motorcycle, an electric power-assisted bicycle, and a railroad vehicle. That is, the electric power consumption device includes the battery pack 10 having the plurality of secondary battery cells 20 each including the integrated circuit 50 having the measuring function to measure the battery status. To drive a conversion device (in particular, a motor, for example) included in these to convert the electric power to the driving power by supplying the electric power, the battery pack 10 can be discharged, and the battery pack 10 can also be charged by using regenerative energy from the device. These electric power consumption devices include a control device including a battery level display and a control device for processing the information regarding the control of the electric power consumption device based on the information regarding the secondary battery cell 20, for example.

In the secondary battery cell, the battery pack 10, or the electric power consumption device of Example 1, the secondary battery cell 20 includes the integrated circuit 50 and the integrated circuit 50 has the measuring function to measure the battery status. Therefore, the secondary battery cell 20 itself can collect the battery status information, and the configuration of the entire battery pack 10 can be simplified. In addition, since the integrated circuit 50 provided in each secondary battery cell 20 stores the individual information, such as the identification number and the authentication number given to the secondary battery cell 20, each secondary battery cell 20 can be easily identified and it can be easily and surely determined whether the secondary battery cell is the authenticated and authorized secondary battery cell or not. Additionally, because the power source is the external power source and the information is transferred by the wireless method, the integrated circuit 50 can be driven without providing the special wiring for sensing and the battery status can be known. Therefore, the configuration of the entire battery pack 10 can be simplified.

Also, the power source of the integrated circuit 50 can be the secondary battery cell. That is, the secondary battery cell can be in the form of [3] described above. In this case, the current measuring unit 54 and the voltage measuring unit 55 of the integrated circuit 50 are connected to the positive electrode lead 45 and the battery can 31 via the wiring 57 to measure the current and the voltage, but the electric power may be supplied to the integrated circuit 50 via the wiring 57.

EXAMPLE 2

Figure 5:
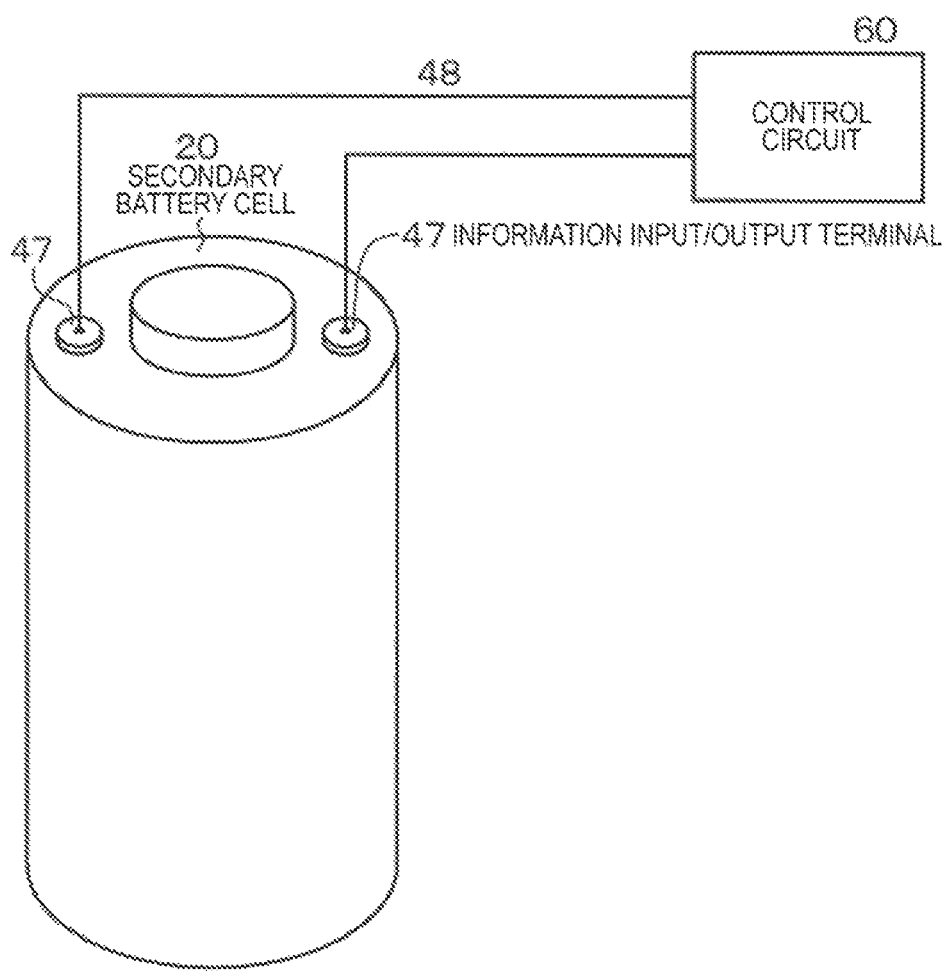
FIG. 5 is a schematic perspective view of a secondary battery cell of Example 2.
Figure 6:
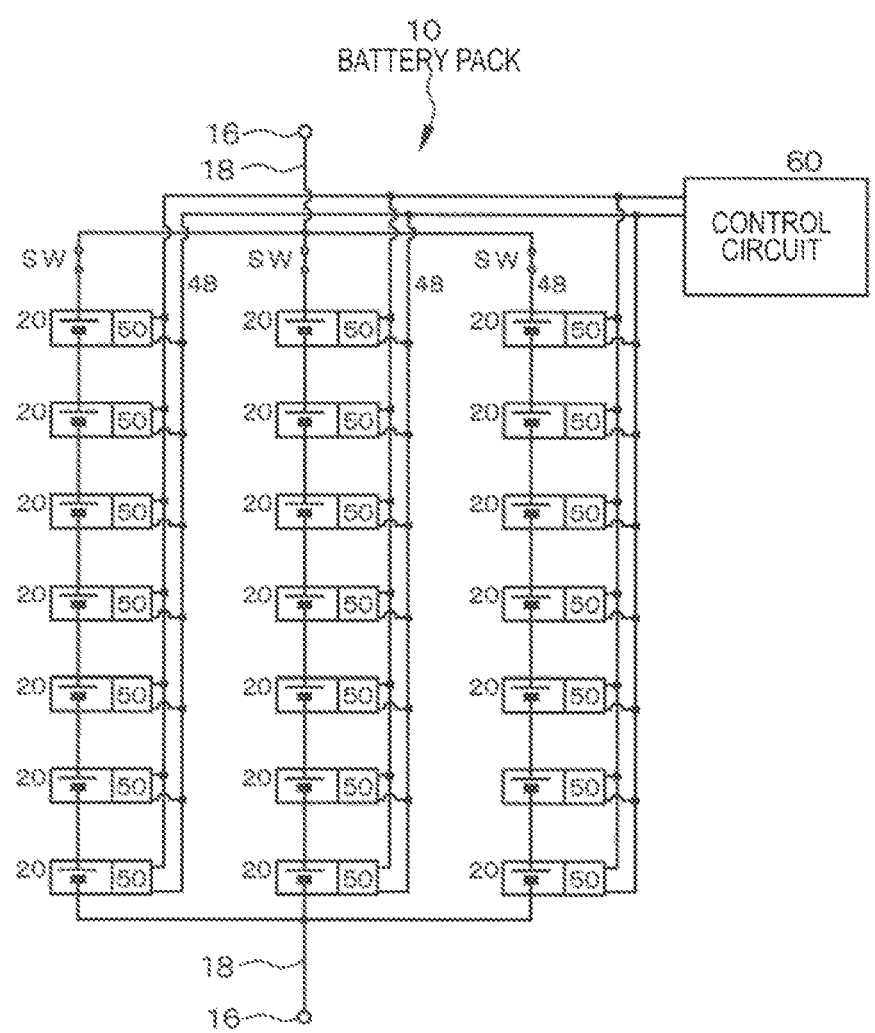
FIG. 6 is a view showing a connection status of the secondary battery cells in a battery pack of Example 2.

Example 2 is a modification of Example 1. In Example 2, as is the case in Example 1, an integrated circuit 50 is arranged in a secondary battery cell 20, and a power source is an external power source. On the other hand, the information is transferred by the wired method. That is, the integrated circuit 50 is in the form of [2]. In Example 2, as a connection status (a status of an assembled battery) of the secondary battery cells in a battery pack is shown in FIG. 6, individual information and a measured battery status are transmitted to outside (in particular, a control circuit 60) the secondary battery cell 20 through wire transmission. As a schematic perspective view of the secondary battery cell is shown in FIG. 5, an information input/output terminal 47 is provided in the secondary battery cell 20 and the integrated circuit (an illustration is omitted) arranged in the secondary battery cell 20 is connected to the control circuit 60 via the information input/output terminal 47 and a wiring (a wiring for sensing) 48.

Figure 7:
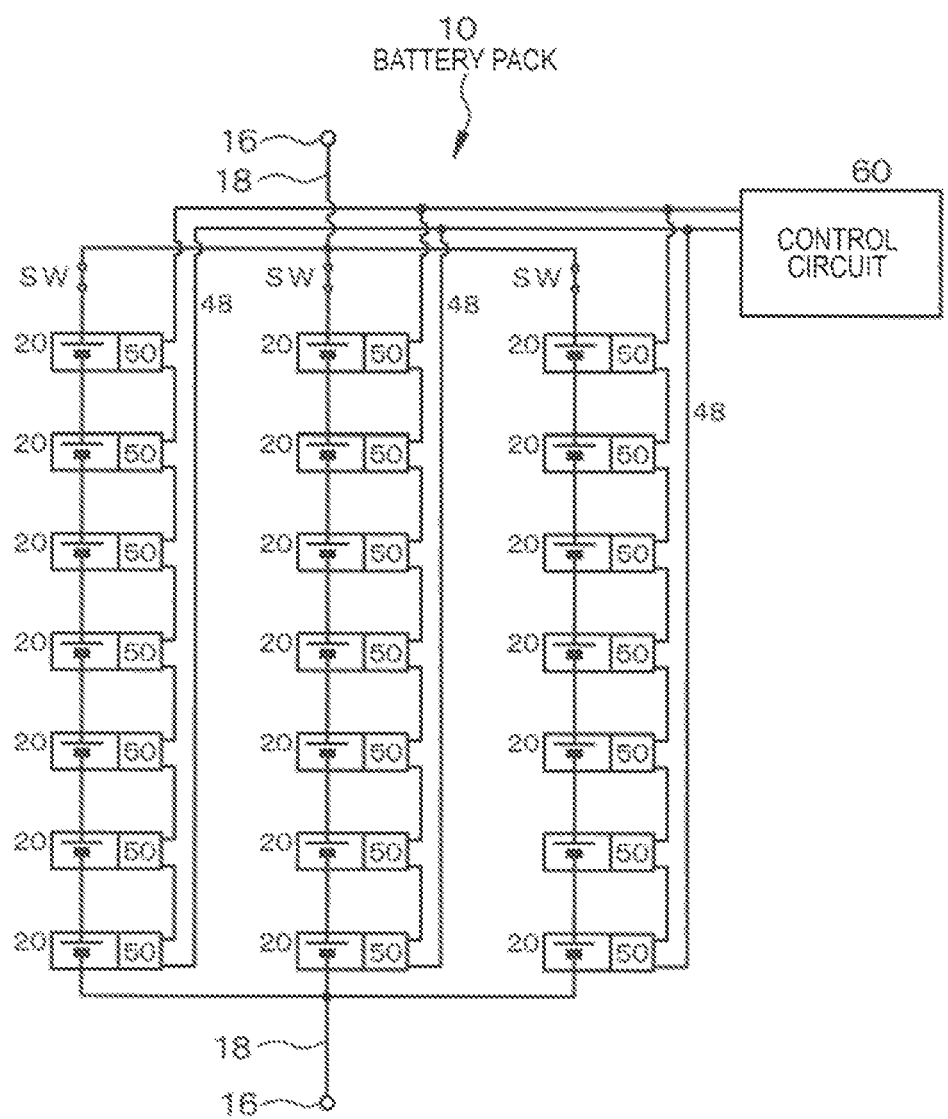
FIG. 7 is a view showing a connection status of the secondary battery cells in a modification of the battery pack of Example 2.

Since the battery pack and the secondary battery cell of Example 2 have the same configuration and structure as the battery pack and the secondary battery cell explained in Example 1 except for the above points, the detailed explanation is omitted. In Example 2, a so-called a bus connection method is adopted to measure the secondary battery cell in sequence. Therefore, the battery status of all the secondary battery cells in the battery pack can be known by a small number of wirings for sensing, and the complicated wiring for sensing is not needed. Also, the power source of the integrated circuit 50 can be the secondary battery cell. That is, the secondary battery cell can be in the form of [4] described above. As shown in FIG. 7, a so-called a cascade connection method may be adopted to measure the secondary battery cell in sequence.

In the battery pack of Example 2, a control signal (an external electrical signal) is supplied from the control circuit 60 to the integrated circuit 50 via the wiring 48. The control signal is supplied to the integrated circuit 50 during the communication period. At the side of the integrated circuit, the necessary electric power for the operation is obtained by rectifying the control signal, and at the same time, an alternating-current component of the control signal is used as a clock. After the control signal is output from the control circuit 60, a command and an ID number are notified from the control circuit 60 to the integrated circuit 50 via the wiring 48 after the necessary preparation period to stabilize the operation at the integrated circuit side. At the side of the integrated circuit, when the transmitted ID number is compared with and, as a result, corresponds to an ID number of the integrated circuit itself, the battery status is output to the control circuit 60 according to the command. In this way, since the integrated circuit 50 obtains the necessary electric power and the clock for the operation based on the control signal input from the outside (in particular, the control circuit 60) via the information input/output terminal 47, the power source part is not needed. In addition, in this method, only when the ID number of the integrated circuit itself is compared with and, as a result, corresponds to the ID number from the control circuit 60, the battery status is transmitted to the control circuit 60 from the secondary battery cell side. Therefore, the respective battery statuses in the battery pack 10 configured of many secondary battery cells 20 can be obtained without getting confused. Similarly to Example 1, the communication may be encrypted and the authenticate operation or the like may be performed. The same applies to Examples below.

EXAMPLE 3

Figure 8:
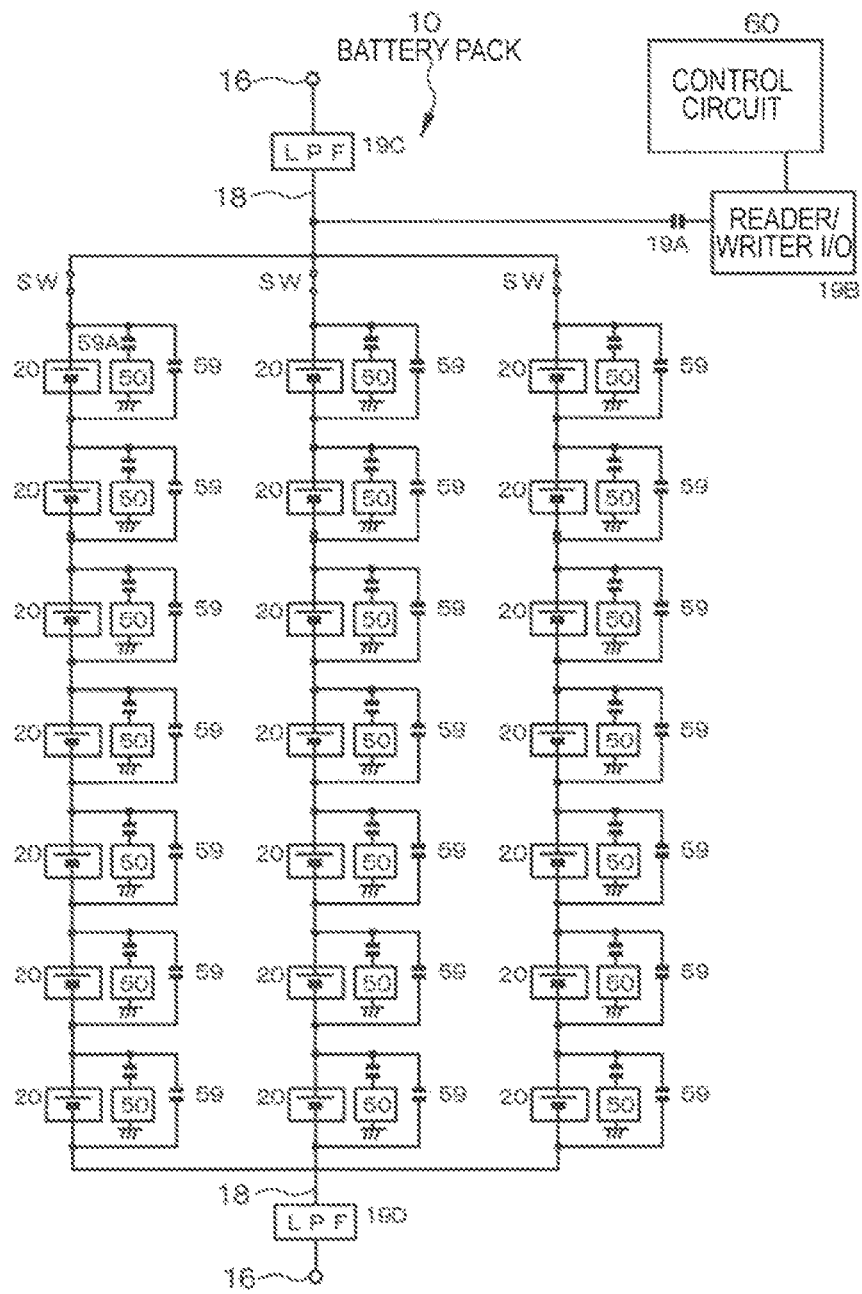
FIG. 8 is a view showing a connection status of secondary battery cells in a battery pack of Example 3.

Example 3 is a modification of Example 2. In Example 2, the integrated circuit 50 is configured to connect to the control circuit 60 via the information input/output terminal 47 and the wiring (the wiring for sensing) 48. On the other hand, in Example 3, as a connection status of secondary battery cells in a battery pack is shown in FIG. 8, an integrated circuit 50 is connected via a capacitor 59A to an electric power line 18, which is provided in a secondary battery cell 20, to supply the electric power to the outside and a coupling capacitor 59 as a bandpass filter (BPF) is provided between the integrated circuit 50 and the electric power line 18. Further, the coupling capacitor 59 is connected to the secondary battery cell 20 in parallel. The coupling capacitor 59 may be integrated in the integrated circuit 50 or may be provided separately from the integrated circuit 50, and it is only necessary to design the coupling capacitor 59 so that the coupling capacitor 59 can pass a frequency suitable for the communication frequency to transmit individual information and/or a measured battery status. A control circuit 60 is connected to the electric power line 18. Between the control circuit 60 and the electric power line 18, a coupling capacitor 19A and a reader/writer I/O 19B are arranged. It is also only necessary to design the coupling capacitor 19A so that the coupling capacitor 19A can pass a frequency suitable for the communication frequency to transmit the individual information and/or the measured battery status. At an output unit 16 side of the electric power line 18, low-pass filters 19C and 19D configured of reactance are provided, and structured such that the individual information and/or the measured battery status cannot pass through the output unit 16. Depending on the case, the low-pass filter 19C and the integrated circuit 50 may be connected to the electric power line outside the output unit 16.

In this way, in Example 3, in the connection status (a status of the assembled battery) of the secondary battery cells in the battery pack, the individual information and the measured battery status are transmitted to outside (in particular, the control circuit 60) the secondary battery cell 20 by wire transmission while being superimposed on an electric power line path. Similarly to Example 1, the integrated circuit 50 may be connected to a positive electrode lead 45 and a battery can 31 via a wiring 57. Unlike Example 2, in the secondary battery cell 20, the information input/output terminal 47 need not be provided and the wiring (the wiring for sensing) 48 also need not be provided. Since the battery pack and the secondary battery cell of Example 3 have the same configuration and structure as the battery pack and the secondary battery cell explained in Examples 1 and 2 except for the above points, the detailed explanation is omitted.

EXAMPLE 4

Figure 9A:
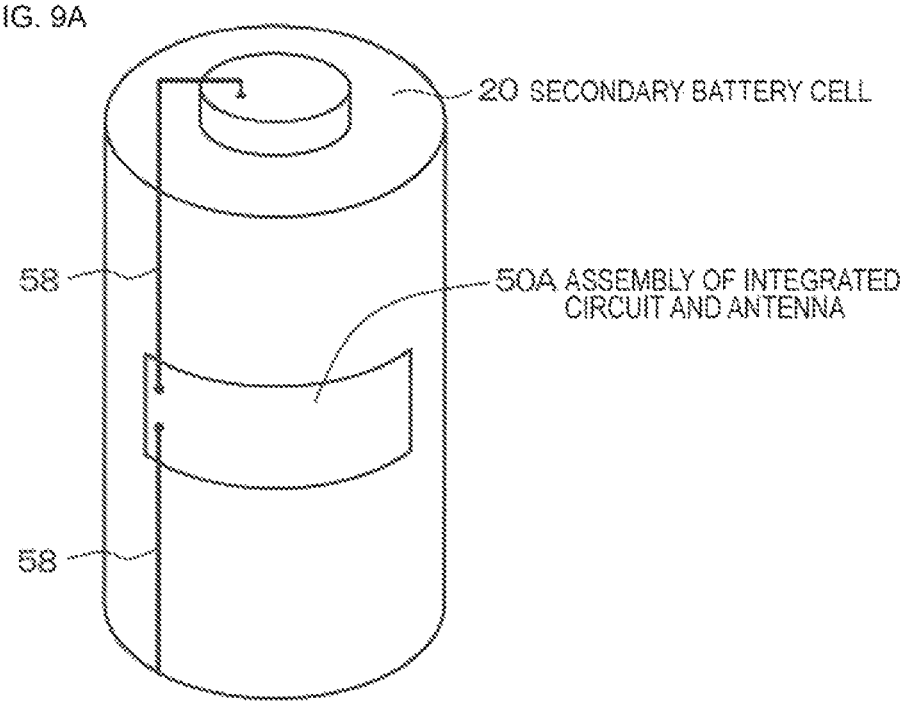
FIG. 9(A) is a schematic perspective view of a secondary battery cell of Example 4.
Figure 9B:
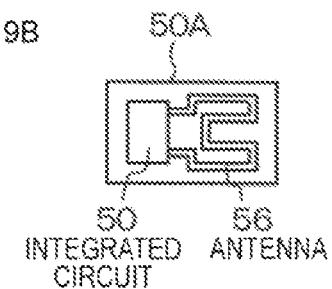
FIG. 9(B) is a schematic view of an assembly of an integrated circuit and an antennae.

Example 4 is also a modification of Example 1. As a schematic perspective view of a secondary battery cell is shown in FIG. 9(A) and a schematic view of an integrated circuit assembly (a wireless IC tag) 50A, which is an assembly of an integrated circuit 50 and an antenna 56, is shown in FIG. 9(B), the integrated circuit 50 in Example 4 is arranged outside a secondary battery cell 20, unlike Example 1. In particular, the integrated circuit 50 is stuck on the outside of the secondary battery cell 20 or the integrated circuit 50 is laminated on the outside of the secondary battery cell 20 by appropriate means (for example, an exterior film). On the other hand, similarly to Example 1, a power source of the integrated circuit 50 is an external power source, and the information is transferred by the wireless method. That is, the form [5] described above is adopted. The integrated circuit 50 includes the antenna 56. A current measuring unit 54 and a voltage measuring unit 55 of the integrated circuit 50 are connected to a positive electrode lead 45 and a battery can 31 via a wiring 58 to measure the current and the voltage. Since a battery pack and the secondary battery cell of Example 4 have the same configuration and structure as the battery pack and the secondary battery cell explained in Example 1 except for the above points, the detailed explanation is omitted. Also, the power source of the integrated circuit 50 can be the secondary battery cell. That is, the secondary battery cell can be in the form of [7] described above. In this case, the electric power may be supplied from a battery lid 34 and the battery can 31 of the secondary battery cell to the integrated circuit 50 via the wiring 58.

EXAMPLE 5

Figure 10:
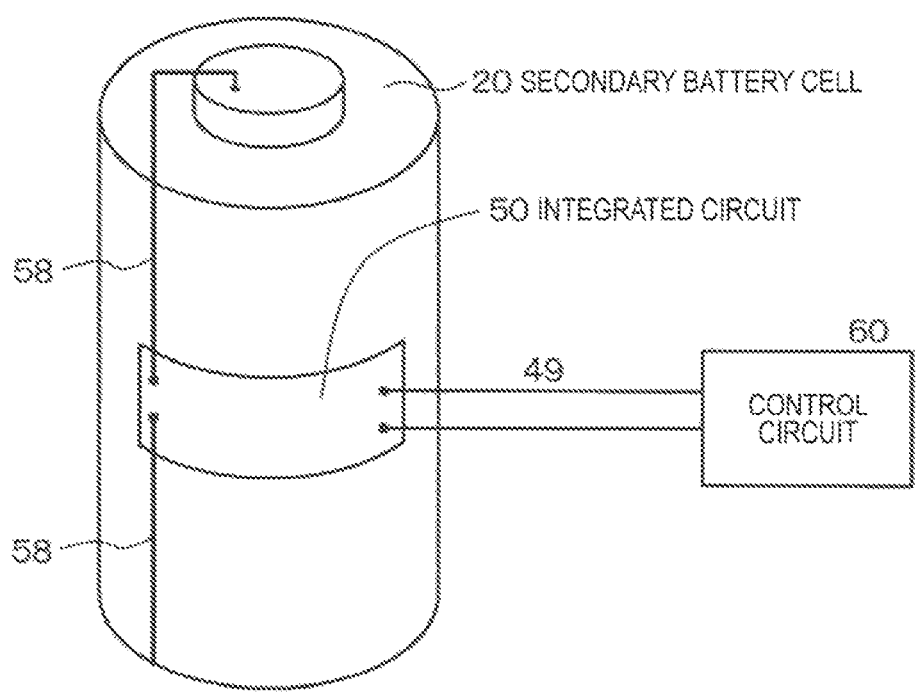
FIG. 10 is a schematic perspective view of a secondary battery cell of Example 5.

Example 5 is also a modification of Example 1. As a schematic perspective view of a secondary battery cell is shown in FIG. 10, in Example 5, an integrated circuit 50 is arranged outside a secondary battery cell 20, similarly to Example 4. Also, a power source of the integrated circuit 50 is the secondary battery cell, and the information is transferred by the wired method (including a form in which the integrated circuit is connected to an electric power line. The same applies hereinafter.) That is, the form [8] described above is adopted. In particular, the integrated circuit 50 may be connected to a battery lid 34 and a battery can 31 of the secondary battery cell via a wiring 58, and the integrated circuit 50 is connected to a control circuit 60 by a wiring (a wiring for sensing) 49. Since a battery pack and the secondary battery cell of Example 5 have the same configuration and structure as the battery pack and the secondary battery cell explained in Example 1 except for the above points, the detailed explanation is omitted. Also, similarly to Example 1, the power source, which drives the integrated circuit 50, may be an external power source. That is, the secondary battery cell can be in the form of [6] described above.

EXAMPLE 6

Example 6 is also a modification of Example 1. In Example 6, a secondary battery cell 120 is a prismatic secondary battery cell. As a schematic perspective view is shown in FIG. 11(A), an integrated circuit is arranged in the secondary battery cell 120 (in particular, gaps surrounded by an insulating spacer arranged just below a sealing plate (cap plate)), and a power source is, similarly to Example 1, an external power source, and the information is transferred by the wireless method. That is, the form [1] described above is adopted. The integrated circuit includes an antenna not shown. In addition, in FIG. 11(A) or in FIG. 11(B), which will be described below, an integrated circuit assembly 50A arranged in the secondary battery cell 120 is schematically illustrated by a dotted line. In the secondary battery cell 120, a wound electrode body, obtained by winding a positive electrode material and a negative electrode material via a separator, is contained. Since the secondary battery cell 120 or a battery pack of Example 6 can be substantially the same as the secondary battery cell or the battery pack of Example 1 except for the above points, the detailed explanation is omitted. Also, the power source of the integrated circuit 50 can be the secondary battery cell. That is, the secondary battery cell can be in the form of [3] described above.

Also, the integrated circuit is arranged in the secondary battery cell 120 and the power source is the external power source, but the information can be transferred by the wired method. That is, the secondary battery cell can be in the form of [2] described above, and individual information and a measured battery status are transmitted to outside (in particular, a control circuit 60) the secondary battery cell 120 through wire transmission. In particular, as a schematic perspective view is shown in FIG. 11(B), an information input/output terminal 47 is provided in the secondary battery cell 120, and the integrated circuit arranged in the secondary battery cell 120 is connected to the control circuit 60 via the information input/output terminal 47 and a wiring (not shown). Also, the power source of the integrated circuit can be the secondary battery cell. That is, the secondary battery cell can be in the form of [4] described above.

Figure 12A:
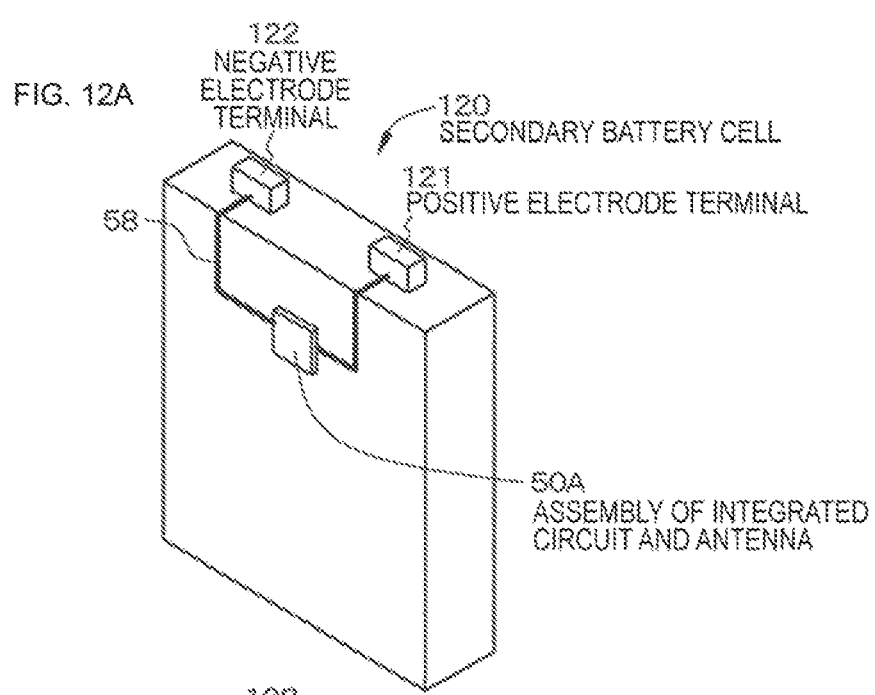
FIGS. 12(A) and 12(B) are schematic perspective views of the modification of the secondary battery cell of Example 6.

Also, as a schematic perspective view of the secondary battery cell 120 is shown in FIG. 12(A), the integrated circuit is arranged outside the secondary battery cell 120. In particular, the integrated circuit (more specifically, the integrated circuit assembly 50A) is stuck on the outside of the secondary battery cell 120 or the integrated circuit is laminated on the outside of the secondary battery cell 120 by appropriate means (for example, an exterior film). The integrated circuit has the same configuration and structure as the one explained in Example 4. The power source of the integrated circuit is the external power source, and the information is transferred by the wireless method. That is, the secondary battery cell can be in the form of [5] described above. The integrated circuit includes the antenna. A current measuring unit and a voltage measuring unit of the integrated circuit are connected to a positive electrode terminal 121 and a negative electrode terminal 122 via a wiring 58 to measure the current and the voltage. Also, the power source of the integrated circuit can be the secondary battery cell. That is, the secondary battery cell can be in the form of [7] described above. In this case, the electric power may be supplied from the positive electrode terminal 121 and the negative electrode terminal 122 of the secondary battery cell to the integrated circuit via the wiring 58.

Figure 12B:
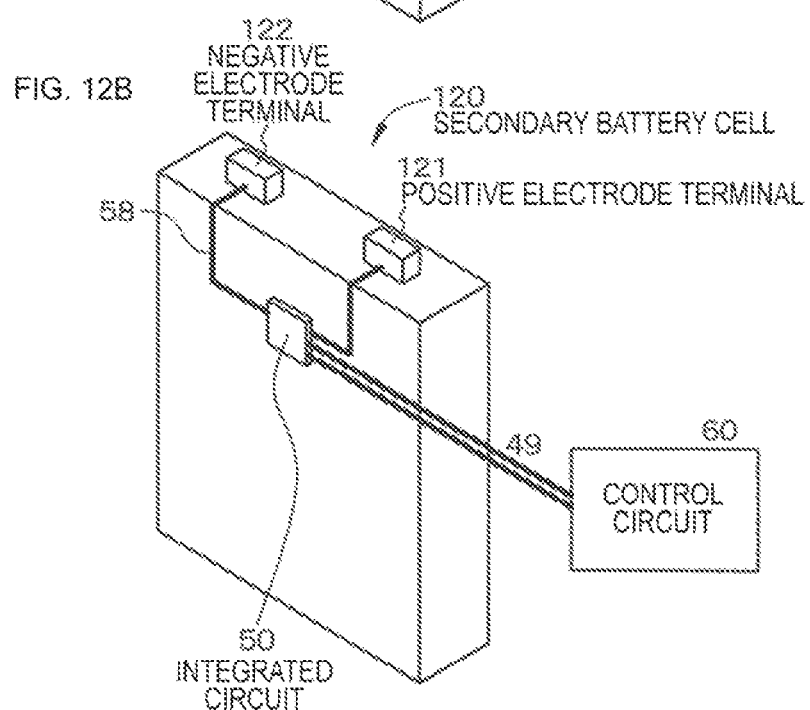

Also, as a schematic perspective view of the secondary battery cell 120 is shown in FIG. 12(B), the integrated circuit is arranged, similarly to Example 4, outside the secondary battery cell 120. The power source of the integrated circuit is the secondary battery cell, and the information is transferred by the wired method. That is, the secondary battery cell can be in the form of [8] described above. In particular, the integrated circuit is connected to the positive electrode terminal 121 and the negative electrode terminal 122 of the secondary battery cell 120 via the wiring 58, and the integrated circuit is connected to the control circuit 60 by a wiring (a wiring for sensing) 49. In addition, the power source, which drives the integrated circuit, may be the external power source. That is, the secondary battery cell can be in the form of [6] described above.

Figure 13A:
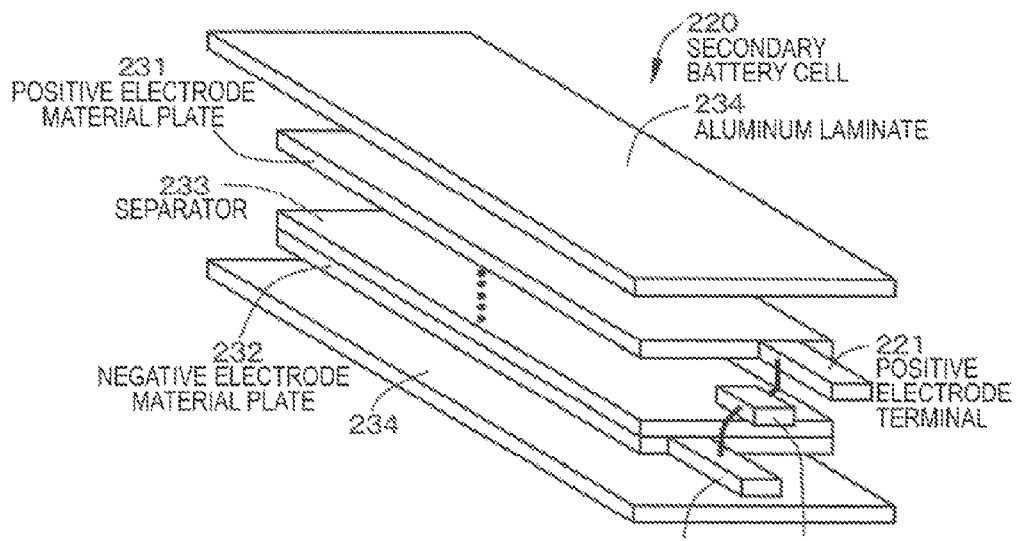
FIGS. 13(A) and 13(B) are respectively a schematic exploded perspective view of the secondary battery cell of Example 6 and a schematic exploded perspective view of its modification.
Figure 13B:
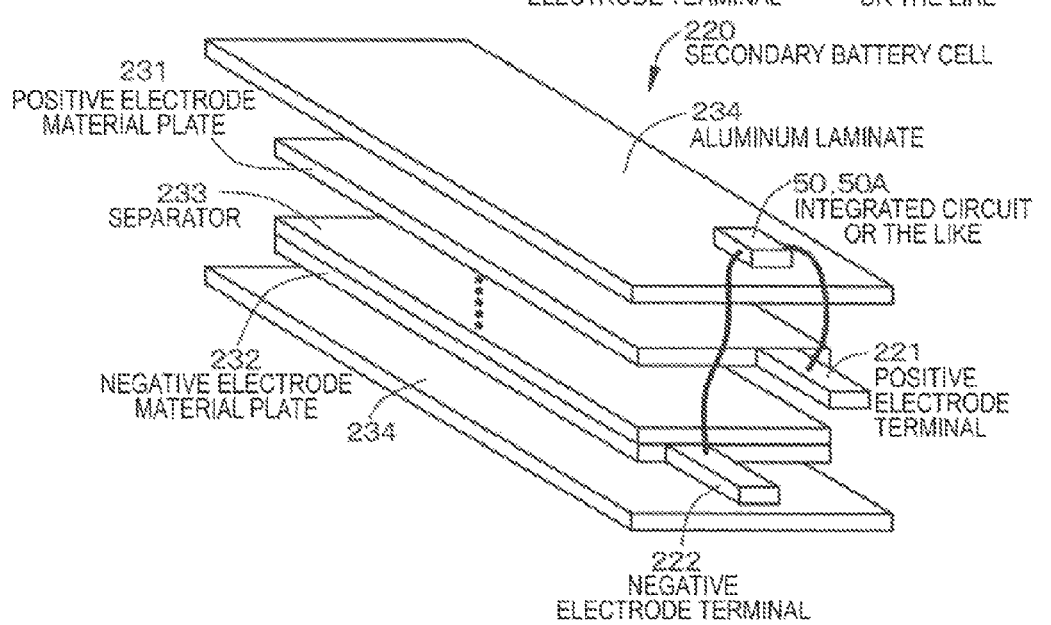

The secondary battery cell can be a laminated type. As a schematic exploded perspective view is shown in FIGS. 13(A) and 13(B), a secondary battery cell 220 has a structure in which a separator 233 is inserted between a positive electrode material plate 231 and a negative electrode material plate 232 for insulation, and a layered structure having a plurality of layers of these is provided, and the layered structure is sealed together with electrolytic solution from the top and the bottom by aluminum laminates 234. On the positive electrode material plate 231 and the negative electrode material plate 232, a positive electrode terminal 221 and a negative electrode terminal 222 are respectively formed and are projected outside from the stuck parts of the aluminum laminates 234.

Here, in the secondary battery cell 220 shown in FIG. 13(A), the integrated circuit 50 or the integrated circuit assembly 50A is connected to the positive electrode terminal 221 and the negative electrode terminal 222 and is positioned on the stuck part of the aluminum laminate 234. That is, the integrated circuit 50 or the integrated circuit assembly 50A is arranged in the secondary battery cell 220. It can be in a form in which the power source is the external power source and the information is transferred by the wireless method or wired method, or can be in a form in which the power source is the secondary battery cell and the information is transferred by the wireless method or wired method.

In the secondary battery cell 220 shown in FIG. 13(B), the integrated circuit 50 or the integrated circuit assembly 50A is connected to the positive electrode terminal 221 and the negative electrode terminal 222, but the integrated circuit 50 or the integrated circuit assembly 50A is positioned outside the aluminum laminate 234. It can be in a form in which the power source is the external power source and the information is transferred by the wireless method or wired method, or can be in a form in which the power source is the secondary battery cell and the information is transferred by the wireless method or wired method.

The present invention has been described above based on the preferred examples, but the present invention is not limited in these examples. The configuration, the structure, the connection relationship and the like of the battery pack, the secondary battery cell, the integrated circuit, the control circuit and the like described in the examples are only exemplary and may be changed appropriately.

REFERENCE SIGNS LIST

10 battery pack, 11 main unit, 12 closure member (lid), 13 fixing member (screw), 14 tap portion, 15 identification mark (serial ID), 16 output unit, 17 housing, 18 electric power line, 19A coupling capacitor, 19B reader/writer I/O, 19C and 19D low-pass filter, 20, 120, and 220 secondary battery cell, 31 battery can, 32 upper insulating plate, 33 lower insulating plate, 34 battery lid, 35 safety valve mechanism, 35A disk plate, 36 thermal resistor element (PTC element), 37 gasket, 40 wound electrode body, 41 positive electrode material, 42 negative electrode material, 43 separator, 44 center pin, 45 positive electrode lead, 46 negative electrode lead, 47 information input/output terminal, 48 and 49 wiring (wiring for sensing), 50 integrated circuit, 50A integrated circuit assembly, which is an assembly of integrated circuit and antenna, 51 signal processing unit, 52 memory unit, 53 temperature measuring unit, 54 current measuring unit, 55 voltage measuring unit, 57 and 58 wiring, 59 coupling capacitor, 60 control circuit, 61 MPU, 62 storage means, 63 communication circuit, 64 battery protection circuit, 121 and 221 positive electrode terminal, 122 and 222 negative electrode terminal, 231 positive electrode material plate, 232 negative electrode material plate, 233 separator, 234 aluminum laminate

The invention claimed is:
1. A secondary battery cell, comprising:
an integrated circuit having a measuring function to measure a battery status, wherein the measured battery status is at least one of physical quantities selected from the group consisting of a battery temperature, a battery current, and a battery terminal voltage, wherein the integrated circuit is configured to:
receive an electrical signal from outside the secondary battery cell and obtain an electric power to operate based on rectification of the electrical signal;
store individual information including a first identification number, and receive, after the reception of the electrical signal from outside the secondary battery cell, a second identification number from outside the secondary battery cell; and
transmit one of the individual information or the measured battery status to the outside, based on the received second identification number that corresponds to the first identification number stored in the integrated circuit.

2. The secondary battery cell according to claim 1, wherein the integrated circuit is further configured to wirelessly transmit one of the individual information or the measured battery status to the outside of the secondary battery cell.

3. The secondary battery cell according to claim 1, wherein the integrated circuit is further configured to transmit one of the individual information or the measured battery status to the outside of the secondary battery cell through wire transmission.

4. The secondary battery cell according to claim 3, wherein the integrated circuit is connected to an information input/output terminal in the secondary battery cell.

5. The secondary battery cell according to claim 1, further comprising a bandpass filter is between the integrated circuit and an electric power line.

6. The secondary battery cell according to claim 1, wherein an exterior material of the secondary battery cell is configured as an antenna.

7. A battery pack, comprising:
a plurality of secondary battery cells, each of the plurality of secondary battery cells including:
an integrated circuit having a measuring function to measure a battery status, wherein the measured battery status is at least one of physical quantities selected from the group consisting of a battery temperature, a battery current, and a battery terminal voltage, wherein the integrated circuit is configured to:
receive an electrical signal from outside the secondary battery cell and obtain an electric power to operate based on rectification of the electrical signal;
store individual information including a first identification number, and receive, after the reception of the electrical signal from outside the secondary battery cell, a second identification number from outside the secondary battery cell; and
transmit one of the individual information or the measured battery status to the outside, based on the received second identification number that corresponds to the first identification number stored in the integrated circuit.

8. An electric power consumption device, comprising:
a battery pack including a plurality of secondary battery cells, each of the plurality of secondary battery cells including:
an integrated circuit having a measuring function to measure a battery status, wherein the measured battery status is at least one of physical quantities selected from the group consisting of a battery temperature, a battery current, and a battery terminal voltage, wherein the integrated circuit is configured to:
receive an electrical signal from outside the secondary battery cell and obtain an electric power to operate based on rectification of the electrical signal;
store individual information including a first identification number, and receive, after the reception of the electrical signal from outside the secondary battery cell, a second identification number from outside the secondary battery cell; and
transmit one of the individual information or the measured battery status to the outside, based on the received second identification number that corresponds to the first identification number stored in the integrated circuit.

* * * * *